United States Patent
Fan et al.

(10) Patent No.: US 11,698,653 B2
(45) Date of Patent: Jul. 11, 2023

(54) SYSTEM, DEVICE AND METHOD FOR GENERATING A BIASING CURRENT

(71) Applicant: Arm Limited, Cambridge (GB)

(72) Inventors: Philex Ming-Yan Fan, Cambridge (GB); Benoit Labbe, Cambridge (GB); Parameshwarappa Anand Kumar Savanth, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/520,112

(22) Filed: Jul. 23, 2019

(65) Prior Publication Data

US 2021/0026389 A1 Jan. 28, 2021

(51) Int. Cl.
*G05F 3/20* (2006.01)
*H03L 1/00* (2006.01)

(52) U.S. Cl.
CPC . *G05F 3/20* (2013.01); *H03L 1/00* (2013.01)

(58) Field of Classification Search
None
See application file for complete search history.

(56) References Cited

U.S. PATENT DOCUMENTS

| | | | | |
|---|---|---|---|---|
| 7,218,170 B1* | 5/2007 | Carter | | G05F 3/262 323/315 |
| 7,667,449 B2* | 2/2010 | Takeda | | G05F 3/262 323/315 |
| 2005/0266820 A1* | 12/2005 | Behzad | | H04B 1/30 455/306 |
| 2013/0069716 A1 | 3/2013 | Shiue et al. | | |
| 2013/0193939 A1* | 8/2013 | Sakaguchi | | G05F 1/573 323/277 |
| 2014/0266140 A1* | 9/2014 | Iriarte | | G05F 3/242 323/313 |
| 2018/0062598 A1* | 3/2018 | Lee | | H03F 1/223 |
| 2019/0149146 A1 | 5/2019 | Tang et al. | | |

OTHER PUBLICATIONS

Dong, et al.: A 114-pW PMOS-Only, Trim-Free Voltage Reference with 0.26% within-Wafer Inaccuracy for nW Systems; VLSI Symposium; IEEE; 2016.
Lee, et al.; Low Power Battery Supervisory Circuit with Adaptive Battery Health Monitor: VLSI Symposium; IEEE; 2014.
Seok, et al.I A Portable 2-Transistor Pico-watt Temperature-Compensated Voltage Reference Operating at 0.5V; JSSC; vol. 47, No. 10; 2012.
Nicolson, et al.; Improvements in Biasing and Compensation of CMOS Opamps; ISCAS; pp. I-665 to I-668; 2004.
PCT International Search Report and Written Opinion; PCT/GB2020/051655; dated Sep. 24, 2020.
Amaud, et al.; An Asymmetrical Bulk-Modified Composite MOS Transistor with Enhanced Linearity; 2019 IEEE 10th Latin American Symposium on Circuits & Systems (LASCAS); Feb. 2019. DOI: 10.1109/LASCAS.2019.8667576.

* cited by examiner

*Primary Examiner* — Jeffrey A Gblende
(74) *Attorney, Agent, or Firm* — Pramudji Law Group PLLC; Ari Pramudji

(57) ABSTRACT

Various implementations described herein are directed to multi-stage system. The system may include a first stage having a current bias generator that generates a biasing current. The system may include a second stage that is coupled to the first stage, and the second stage may include a load that utilizes the biasing current generated by the current bias generator.

16 Claims, 3 Drawing Sheets

US 11,698,653 B2

SYSTEM, DEVICE AND METHOD FOR GENERATING A BIASING CURRENT

The present disclosure was made with Government support under Agreement No. HR0011-17-9-0025, awarded by DARPA. The Government may have certain rights in reference to the present disclosure.

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern wireless infrastructure, Internet-of-Things (IoT) devices typically use ultra low power sensor nodes for operation in remote environments. To prolong usage time of battery-powered or battery-less IoT devices, ultra low power operation of IoT sensors are increasingly demanded, and as such, there exists a need for ultra low power current generators for these IoT sensors in a wide array of IoT applications.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to integrated circuitry (IC) that uses bias current generating schemes and techniques for implementing various sensing type applications. For instance, the various schemes and techniques described herein may provide for a low temperature-dependent, self-stabilizing, and area-efficient bias current generator for Internet-of-Things (IoT) sensing applications in a low current (e.g., nano-ampere) range of operation. In some implementations, the nano-ampere bias current generator may reduce or eliminate instability and temperature-dependency.

Various implementations of bias current generating schemes and techniques will be described in detail herein with reference to FIGS. 1A-3.

Figures 1A, 1B:
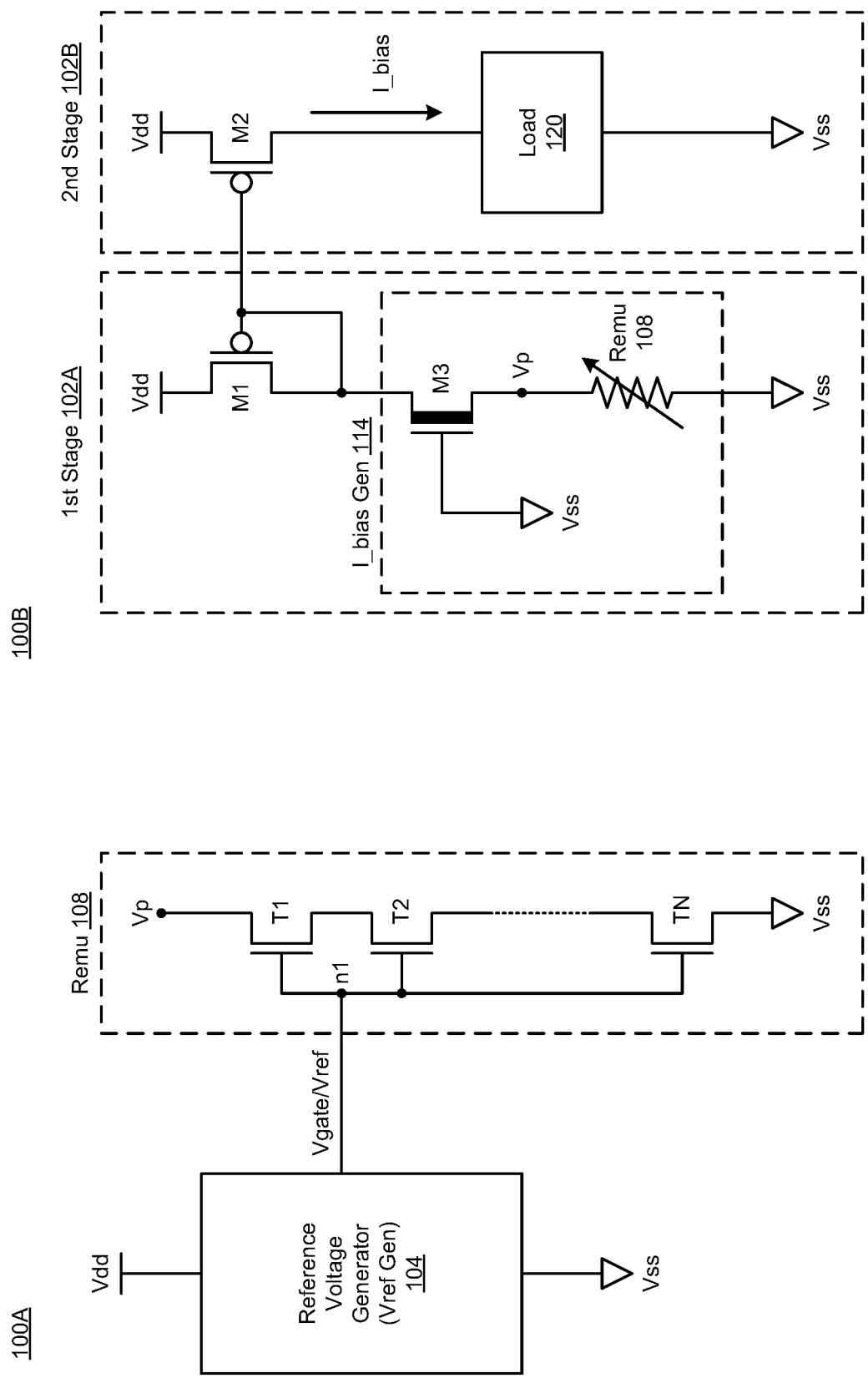
FIGS. 1A-1C illustrate various diagrams of bias current generating circuitry in accordance with various implementations described herein.
Figure 1C:
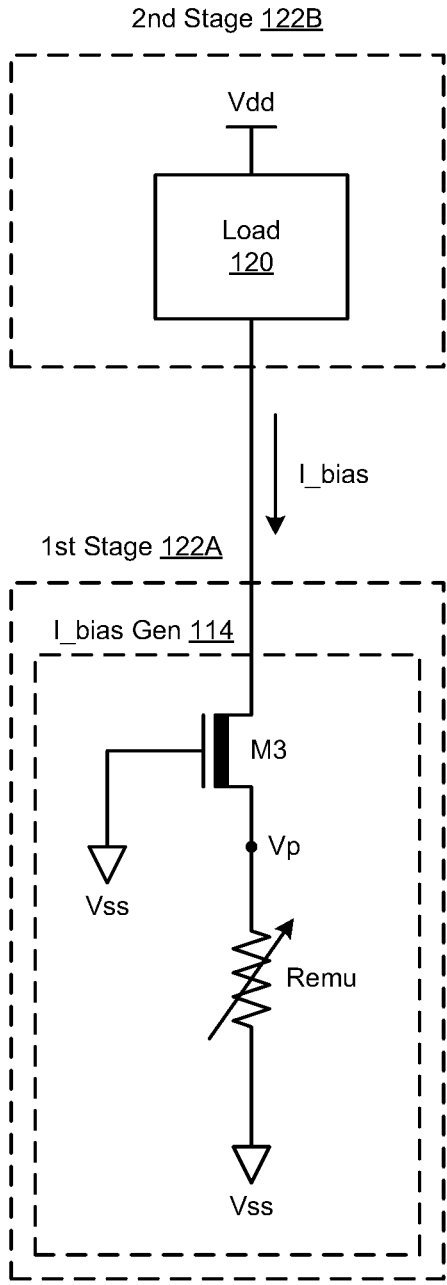

FIGS. 1A-1C illustrate various diagrams of bias current generating circuitry in accordance with various implementations described herein. In particular, FIG. 1A refers to a diagram of bias current generating circuitry 100A, FIG. 1B refers to another diagram of bias current generating circuitry 100B, and FIG. 1C refers to another diagram of bias current generating circuitry 100C. In some instances, the bias current generating circuitry may be implemented as integrated circuitry (IC) in a system or a device having various circuit components arranged and coupled together as an assemblage or combination of parts that provide for a physical circuit design and related structures. In some instances, a method of designing, providing and building the bias current generating circuitry as an IC may involve use of the various circuit components described herein so as to thereby implement bias current generating schemes and techniques associated therewith. Also, the bias current generating circuitry may be implemented as an IC with various embedded systems for various electronic, mobile and Internet-of-things (IoT) applications.

As shown in FIG. 1A, the bias current generating circuitry 100A may include a reference voltage (Vref) generator 104 and an emulated resistor (Remu) 108. The Vref generator 104 may be coupled between a supply voltage (Vdd) and ground (Vss or Gnd), and the Vref generator 104 may be configured to generate and provide a reference gate voltage (Vgate/Vref) to the Remu 108. The Remu 108 includes one or more transistors (T1, T2, . . . , TN) that are coupled between a node voltage (Vp) and ground (Vss or Gnd). In some instances, a number (N) of transistors (T1, T2, . . . , TN) may be coupled together in series between the node voltage (Vp) and ground (Vss or Gnd). For instance, a first transistor (T1) may be coupled between the node voltage (Vp) and a second transistor (T2), and some number (N) of transistors (T2, . . . , TN) may be coupled between the first transistor (T1) and ground (Vss or Gnd). Also, in some implementations, the transistors (T1, T2, . . . , TN) may include N-type metal-oxide-semiconductor (NMOS) transistors. However, in other instances, P-type MOS (PMOS) transistors may be used.

As shown in FIG. 1B, the bias current generating circuitry 100B may include multiple stages including, e.g., a first stage 102A and a second stage 102B that are coupled together and arranged to provide a biasing current (I_bias). In some instances, the first stage 102A may include a current bias generator (I_bias Gen) 114 that generates a biasing current (I_bias). The current bias generator (I_bias Gen) 114 may have a native device structure (e.g., M3) with a gate coupled to ground (Vss or Gnd), wherein the native device structure (e.g., M3) may be a transistor (e.g., an N-type MOS) that is associated with process variation. The current bias generator (I_bias Gen) 114 may include a resistor structure (e.g., Remu 108) that is coupled between a source terminal of the native device structure (e.g., M3) and ground (Vss or Gnd). For instance, as shown in FIG. 1B, the resistor structure (e.g., Remu 108) may be coupled between transistor (M3) at node (Vp) and ground (Vss or Gnd). In some instances, the resistor structure (e.g., Remu 108) may have a first plurality of stacking transistor structures (e.g., T1, T2, . . . , TN) that are coupled in series, and the reference voltage (Vgate/Vref) may be used to activate the first plurality of stacking transistor structures (e.g., T1, T2, . . . , TN) that operate in a triode region and behave as resistors. Also, in some instances, the native device structure (e.g., M3) may be an NMOS transistor. However, a PMOS transistor may be used.

The second stage 102B may be coupled to the first stage 102A, and the second stage 102B may have a load 120 that utilizes the biasing current (I_bias) generated by the current bias generator (I_bias Gen) 114. In some instances, the second stage 102B may be coupled in parallel with the first stage 102A, and the first stage 102A may include a first stacking transistor structure (e.g., M1) that is coupled between the supply voltage (e.g., Vdd) and the current bias generator (I_bias Gen 114). The current bias generator (I_bias Gen) 114 may be coupled between the first stacking transistor structure (e.g., M1) and ground (Vss or Gnd). The first stacking transistor structure (e.g., M1) may be coupled as a diode. The second stage 102B may include a second stacking transistor structure (e.g., M2) that is coupled between the supply voltage (Vdd) and the load 120, and also, the load 120 may be coupled between the second stacking transistor structure (e.g., 102) and ground (Vss or Gnd). Also, a gate of the first stacking transistor structure (e.g., M1) may be coupled to a gate of the second stacking transistor structure (e.g., M2). In some instances, the biasing current (I_bias) may develop as an output from the second stacking transistor structure (e.g., M2) to the load 120. In some implementations, transistors (M1, M2) may be PMOS transistors. However, NMOS transistors may be used.

As shown in FIG. 1C, the bias current generating circuitry 100C may include a first stage 122A and a second stage 122B that are implemented differently than the first and second stages 102A, 102B of FIG. 1B. For instance, the first stage 122A may be coupled between the second stage 122B and ground (Vss or Gnd), and the second stage 122B may be coupled in series with the first stage 122A. The second stage 122B may be coupled between the supply voltage (Vdd) and the first stage 122A, and also, the biasing current (I_bias) may develop as an output from the second stage 122B to the first stage 122A. In some instances, the first stage 122A may only include the current bias generator (I_bias Gen 114), and the second stage 122B may only include the load 120.

In some implementations, the source of the native NFET (M3) may be coupled to the resistor (Remu 108), and the gate of the native NFET (M3) may be biased at ground voltage (Vss or Gnd). The resistor (Remu 108) may be implemented with the regular Vth NFETs (T1, T2, ..., TN) that operate in a triode-region and that may be digitally-tuneable against process shift. The gate of the triode-region operated NFETs (T1, T2, ..., TN) may be biased by a 4-transistor (4T) based temperature-compensated voltage reference (Vref Gen 104). In some instances, the native NFET (M3) and the resistor (Remu 108) form a negative-feedback source degenerator that self-stabilizes. Since the drain-source voltage of M3 is large, I_bias may be derived as:

$$I_{BIAS} \approx \mu_3 C_{ox} \frac{W_3}{L_3}(1-m_3)V_T^2 e^{\left(\frac{-V_P}{m_3 V_T}\right)} \quad (1)$$

and $$V_P \approx 1.5 m_3 V_T \text{ and } \mu_3 \propto T^{-1.5} \quad (2)$$

where $m_3$ and $\mu_3$ refer to a sub-threshold slope factor and carrier mobility of native NFET (M3), respectively; $V_T$ is thermal voltage; T is absolute temperature. M3 sits in a lightly-doped p-substrate, so temperature dependence of $\mu_3$ mainly obeys lattice scattering behavior. Also, it may be seen that $I_{BIAS} \propto T^{0.5}$.

Figure 2:
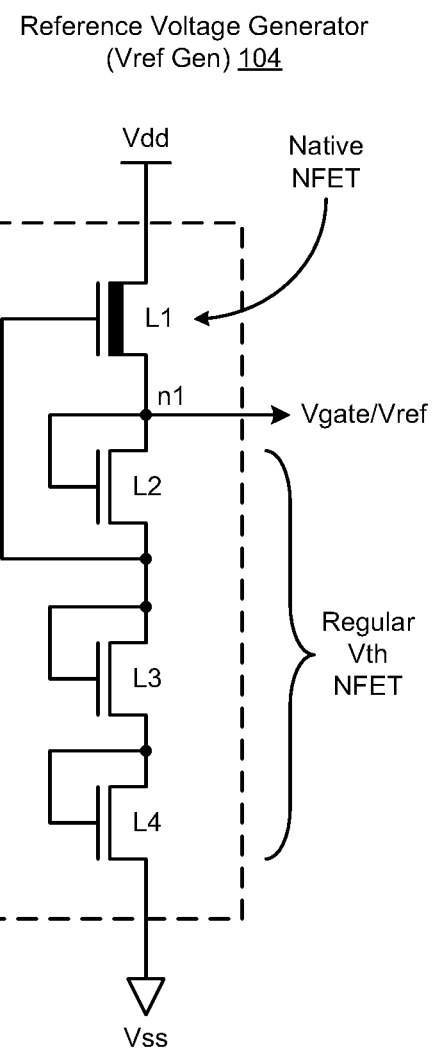
FIG. 2 illustrates a diagram of a reference voltage generating circuitry in accordance with various implementations described herein.

FIG. 2 illustrates a diagram of reference voltage generating circuitry 200 in accordance with various implementations described herein. In some implementations, the reference voltage generating circuitry 200 may refer to the reference voltage generator (Vref) 104 as shown in FIG. 1A.

As shown in FIG. 2, the reference voltage generator 104 may be configured to generate the reference voltage (Vref/Vgate), and the reference voltage generator 104 may include a native device structure (e.g., L1, a native NMOS or NFET) and a second plurality of stacking transistor structures (e.g., L2, L3, L4) that may be coupled in series between the supply voltage (Vdd) and ground (Vss or Gnd).

In some implementations, as shown, the reference voltage generator 104 may include a first transistor (L1), a second transistor (L2), a third transistor (L3), and a fourth transistor (L4) that are coupled in series between the supply voltage (Vdd) and ground (Vss or Gnd). The first transistor (L1) may be coupled between the supply voltage (Vdd) and the second transistor (L2) at an output node (n1), and also, the output of the reference voltage generator 104 may be provided from the output node (n1) as an output of the first transistor (L1). The second transistor (L2) may be coupled between the first transistor (L1) and the third transistor (L3), and a gate of the first transistor (L1) may be coupled to an output of the second transistor (L2), and a gate of the second transistor (L2) may be coupled to the output node (n1). The third transistor (L3) may be coupled between the second transistor (L2) and the fourth transistor (L4), and a gate of the third transistor (L3) may be coupled to the output of the second transistor (L2). The fourth transistor (L4) may be coupled between the third transistor (L3) and ground (Vss or Gnd), and a gate of the fourth transistor (L4) may be coupled to the output of the third transistor (L3).

In some implementations, the first transistor (L1) may be an NMOS transistor having a native device structure, and the first transistor (L1) may be referred to as a native NFET (i.e., an N-type field effect transistor that is associated with process variation). Also, the second transistor (L2), the third transistor (L3), and the fourth transistor (L4) may be NMOS transistors, and the transistors (L2, L3, L4) may be referred to as regular NFETs with regular or standard voltage thresholds (Vth). In other implementations, one or more of the transistors (L1, L2, L3, L4) may be PMOS transistors.

In some implementations, the reference voltage generator (Vref Gen) 104 may be embodied as a 4-transistor (4T) voltage reference for generating Vgate/Vref for biasing Remu 108 in the I_bias generator 114. The stacked, diode-connected, regular-Vth NFETs (T1, T2, ..., TN) may be configured to provide a Vgate/Vref voltage of less than 1.4V, with a total power in this 4T voltage reference of less than 250 pW. For instance, the stacked, diode-connected, regular-Vth NFETs (T1, T2, ..., TN) may be configured to effectively increase the Vgate/Vref voltage, e.g., to about 0.9V, with a total power in this 4T voltage reference of about 160 pW at Vdd=1.2V with temperature at about 25° C.

Figure 3:
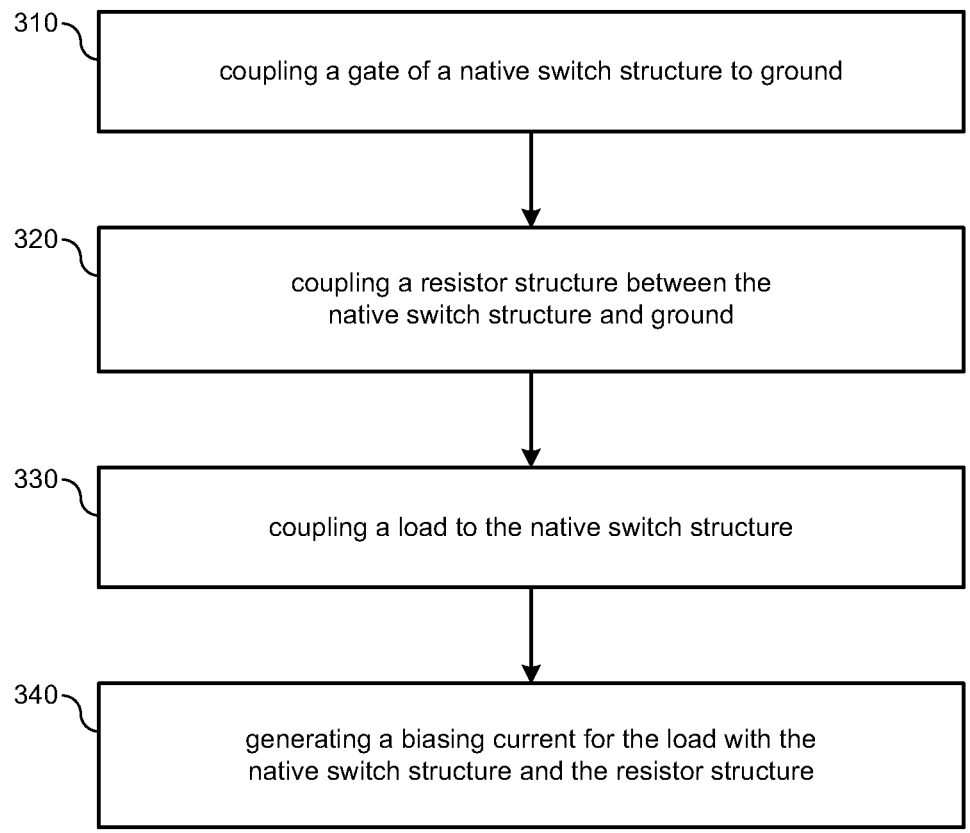
FIG. 3 illustrates a process diagram of a method for providing bias current generating circuitry in accordance with implementations described herein.

FIG. 3 illustrates a process diagram of a method 300 for providing bias current generating circuitry in accordance with implementations described herein.

It should be understood that even though method 300 may indicate a particular order of operation execution, in some cases, various certain portions of the operations may be executed in a different order, and on different systems. In other cases, additional operations and/or steps may be added to and/or omitted from method 300. Also, method 300 may be implemented in hardware and/or software. If implemented in hardware, the method 300 may be implemented with various circuit elements, such as described herein above in reference to FIGS. 1A-2. If implemented in software, the method 300 may be implemented as a program and/or software instruction process that may be configured for providing bias current generating techniques as described herein. Also, if implemented in software, instructions related to implementing the method 300 may be stored in memory and/or a database. For instance, a computer or various other types of computing devices having a processor and memory may be configured to perform method 300.

As described and shown in reference to FIG. 3, method 300 may be used for designing, creating, routing, fabricating and/or manufacturing an integrated circuit (IC) that implements bias current generating schemes and techniques described herein. Also, in reference to FIG. 3, method 300 may be configured to translate the physical design of an integrated circuit (IC) while preserving logical behaviors and characteristics.

At block 310, method 300 may couple a gate of a native device structure to ground (Vss or Gnd). The native device structure may be a native transistor (e.g., NMOS) that is associated with process variation. Also, at block 320, method 300 may couple a resistor structure between the native device structure and ground (Vss or Gnd), and the resistor structure may be coupled between a source terminal of the native device structure and ground. In some instances, the resistor structure may have a first plurality of stacking transistor structures coupled in series, and a reference voltage may be used to activate the first plurality of stacking transistor structures. At block 330, method 300 may couple a load to the native device structure, and at block 340, method 300 may generate a biasing current (I_bias) for the load with the native device structure and the resistor structure. In some implementations, method 300 may include generating the reference voltage with a reference voltage generator, and also, the reference voltage generator may have another native device structure and a second plurality of stacking transistor transistors that are coupled in series between a supply voltage and ground.

In some implementations, the native device structure is configured to receive a supply voltage (e.g., Vdd, via a pass transistor), and the native device structure may have a gate coupled to ground (Vss or Gnd). The resistor structure may be coupled between the native device structure and ground, and the native device structure and the resistor structure may be configured to generate the biasing current (I_bias) for the load. Also, the resistor structure has a first plurality of stacking transistor structures coupled in series, and the reference voltage may be used to activate the first plurality of stacking transistor structures. In some instances, a reference voltage generator may be used to generate the reference voltage, and the reference voltage generator may have another native device structure and a second plurality of stacking transistor transistors that are coupled in series between the supply voltage (e.g., Vdd) and ground (Vss or Gnd). Also, in some instances, the load may be coupled in parallel with the native device structure and the resistor structure. Otherwise, in other instances, the load may be coupled in series with the native device structure and the resistor structure. Also, in some instances, method 300 may provide a current bias generator that generates the biasing current (I_bias) for Internet-of-Things (IoT) applications.

Described herein are various implementations of a system. The system may include a first stage having a current bias generator that generates a biasing current. The system may include a second stage coupled to the first stage, and the second stage has a load that utilizes the biasing current generated by the current bias generator.

Described herein are various implementations of a device. The device may include a native device structure that is configured to receive a supply voltage, and the native device structure has a gate coupled to ground. The device may include a resistor structure coupled between the native device structure and ground, and the native device structure and the resistor structure are configured to generate a biasing current for a load.

Described herein are various implementations of a method. The method may include coupling a gate of a native device structure to ground. The method may include coupling a resistor structure between the native device structure and ground. The method may include coupling a load to the native device structure. The method may include generating a biasing current for the load with the native device structure and the resistor structure.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A system, comprising:
   a first stage having a current bias generator that generates a biasing current, the current bias generator including a resistor structure that comprises an emulated resistor;
   a second stage coupled to the first stage, wherein the second stage has a load that utilizes the biasing current generated by the current bias generator; and
   a reference voltage generator that generates a reference voltage,
   wherein the reference voltage generator includes a first native device structure and a first plurality of stacking transistor structures that are coupled in series between the supply voltage and ground,
   wherein the first native device structure includes a gate that is coupled between a first transistor and a second transistor of the first plurality of stacking transistor structures,
   wherein the resistor structure has a second plurality of stacking transistor structures coupled in series, and
   wherein the reference voltage is used to activate the second plurality of stacking transistor structures.

2. The system of claim 1, wherein the current bias generator has a native device structure with a gate coupled to ground.

3. The system of claim 2, wherein the resistor structure of the current bias generator is coupled between a source terminal of the native device structure and ground.

4. A system, comprising:
   a first stage having a current bias generator that generates a biasing current, the current bias generator including a resistor structure that comprises an emulated resistor;
   a second stage coupled to the first stage, wherein the second stage has a load that utilizes the biasing current generated by the current bias generator; and
   a reference voltage generator that generates a reference voltage,
   wherein the reference voltage generator includes a first native device structure and a first plurality of stacking transistor structures that are coupled in series between the supply voltage and ground,
   wherein the first native device structure includes a gate that is coupled between a first transistor and a second transistor of the first plurality of stacking transistor structures,
   wherein the resistor structure has a second plurality of stacking transistor structures coupled in series,
   wherein the current bias generator has a native device structure with a gate coupled to ground,
   wherein the resistor structure of the current bias generator is coupled between a source terminal of the native device structure and ground, and
   wherein the reference voltage is used to activate the second plurality of stacking transistor structures.

5. The system of claim 1, wherein:
   the second stage is coupled in parallel with the first stage,
   the first stage has a first stacking transistor structure coupled between a supply voltage and the current bias generator, and
   the current bias generator is coupled between the first stacking transistor structure and ground.

6. The system of claim 5, wherein the first stacking transistor structure is coupled as a diode.

7. The system of claim 5, wherein the second stage has a second stacking transistor structure coupled between the supply voltage and the load, and wherein the load is coupled between the second stacking transistor structure and ground.

8. The system of claim 7, wherein a gate of the first stacking transistor structure is coupled to a gate of the second stacking transistor structure.

9. The system of claim 1, wherein:
   the second stage is coupled in series with the first stage,
   the first stage is coupled between the second stage and ground, and
   the second stage is coupled between a supply voltage and the first stage.

10. A device, comprising:
    a first native device structure that is configured to receive a supply voltage, wherein the first native device structure has a gate coupled to ground;
    a resistor structure comprising an emulated resistor coupled between the native device structure and ground, wherein the first native device structure and the resistor structure are configured to generate a biasing current for a load; and
    a reference voltage generator that generates a reference voltage,
    wherein the reference voltage generator includes a second native device structure and a first plurality of stacking transistor structures that are coupled in series between the supply voltage and ground,
    wherein the second native device structure includes a gate that is coupled between a first transistor and a second transistor of the first plurality of stacking transistor structures,
    wherein the resistor structure has a second plurality of stacking transistor structures coupled in series, and
    wherein the reference voltage is used to activate the first plurality of stacking transistor structures.

11. The device of claim 10, wherein the load is coupled in parallel with the native device structure and the resistor structure.

12. The device of claim 10, wherein the load is coupled in series with the native device structure and the resistor structure.

13. A method, comprising:
    coupling a gate of a first native device structure to ground;
    coupling a resistor structure between the first native device structure and ground, the resistor structure comprising an emulated resistor;

coupling a load to the first native device structure;
generating a biasing current for the load with the first native device structure and the resistor structure; and
generating a reference voltage with a reference voltage generator,
wherein the reference voltage generator includes a second native device structure and a first plurality of stacking transistor structures that are coupled in series between a supply voltage and ground,
wherein the second native device structure includes a gate that is coupled between a first transistor and a second transistor of the first plurality of stacking transistor structures,
wherein the resistor structure has a second plurality of stacking transistor structures coupled in series, and
wherein the reference voltage is used to activate the second plurality of stacking transistor structures.

14. The method of claim 13, wherein the resistor structure is coupled between a source terminal of the native device structure and ground.

15. A method, comprising:
coupling a gate of a first native device structure to ground;
coupling a resistor structure between the first native device structure and ground, the resistor structure comprising an emulated resistor;
coupling a load to the first native device structure;
generating a biasing current for the load with the first native device structure and the resistor structure; and
generating a reference voltage with a reference voltage generator,
wherein the reference voltage generator includes a second native device structure and a first plurality of stacking transistor structures that are coupled in series between a supply voltage and ground,
wherein the second native device structure includes a gate that is coupled between a first transistor and a second transistor of the first plurality of stacking transistor structures,
wherein the resistor structure has a second plurality of stacking transistor structures coupled in series,
wherein the resistor structure is coupled between a source terminal of the native device structure and ground, and
wherein the reference voltage is used to activate the second plurality of stacking transistor structures.

16. The system of claim 4, wherein the stacking transistor structures operate in a triode region and behave as resistors.

* * * * *